US011049900B2

(12) United States Patent
Azize et al.

(10) Patent No.: US 11,049,900 B2
(45) Date of Patent: Jun. 29, 2021

(54) MONOLITHICALLY INTEGRATED NANOEMITTER LIGHT SOURCE ASSEMBLY

(71) Applicant: Analog Devices, Inc., Norwood, MA (US)

(72) Inventors: Mohamed Azize, Medford, MA (US); Alain Valentin Guery, Boston, MA (US); Mario Joseph Freni, Windham, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/532,189

(22) Filed: Aug. 5, 2019

(65) Prior Publication Data

US 2020/0075664 A1    Mar. 5, 2020

Related U.S. Application Data

(60) Provisional application No. 62/724,826, filed on Aug. 30, 2018.

(51) Int. Cl.
*H01L 27/15*    (2006.01)
*H01L 33/50*    (2010.01)
(Continued)

(52) U.S. Cl.
CPC ............ *H01L 27/156* (2013.01); *H01L 33/46* (2013.01); *H01L 33/504* (2013.01);
(Continued)

(58) Field of Classification Search
None
See application file for complete search history.

(56) References Cited

U.S. PATENT DOCUMENTS

| 7,122,827 B2 | 10/2006 | Alizadeh et al. |
| 8,405,063 B2 | 3/2013 | Kazlas et al. |

(Continued)

FOREIGN PATENT DOCUMENTS

| CN | 102447070 A | 5/2012 |
| CN | 104051672 A | 9/2014 |

(Continued)

OTHER PUBLICATIONS

"International Application Serial No. PCT/US2019/048835, International Search Report dated Nov. 22, 2019", 5 pgs.

(Continued)

*Primary Examiner* — Moazzam Hossain
*Assistant Examiner* — Stanetta D Isaac
(74) *Attorney, Agent, or Firm* — Schwegman Lundberg & Woessner, P.A.

(57) ABSTRACT

Low-cost and high-efficiency monolithically integrated nanoscale-based light emitter techniques can be used in, for example, electronic display applications and spectroscopy applications using spectrometers. Using various techniques, a light emitter can include quantum dots (QDs) and can be arranged to emit light in mono-band (e.g., one wavelength) or in broad-band (e.g., more than one wavelength) such as in the visible to mid-infrared range, e.g., from about 365 nm to about 10 μm. The light emitter nanotechnology can be based on a nanoscale wafer manufacturing for displays and spectroscopy applications.

23 Claims, 15 Drawing Sheets

(51) Int. Cl.
*H01S 5/026* (2006.01)
*H01S 5/06* (2006.01)
*H01S 5/187* (2006.01)
*H01L 33/46* (2010.01)

(52) U.S. Cl.
CPC .......... *H01S 5/0261* (2013.01); *H01S 5/0609* (2013.01); *H01S 5/187* (2013.01)

(56) References Cited

U.S. PATENT DOCUMENTS

| | | |
|---|---|---|
| 9,155,146 B2 | 10/2015 | Lee et al. |
| 9,202,996 B2 | 12/2015 | Orsley et al. |
| 9,685,585 B2 | 6/2017 | Gupta et al. |
| 9,825,016 B1 | 11/2017 | Kim et al. |
| 10,026,912 B1 | 7/2018 | Cao et al. |
| 2005/0082543 A1 | 4/2005 | Alizadeh et al. |
| 2008/0217602 A1 | 9/2008 | Kahen |
| 2008/0258695 A1 | 10/2008 | Kumar et al. |
| 2010/0213438 A1 | 8/2010 | Cho et al. |
| 2010/0283072 A1 | 11/2010 | Kazlas et al. |
| 2014/0014896 A1 | 1/2014 | Chung et al. |
| 2014/0166973 A1 | 6/2014 | Kurtin et al. |
| 2015/0228850 A1 | 8/2015 | Zheng et al. |
| 2015/0362165 A1 | 12/2015 | Chu et al. |
| 2016/0064439 A1 | 3/2016 | Or-Bach et al. |
| 2018/0083423 A1 | 3/2018 | El-ghoroury |
| 2019/0333963 A1* | 10/2019 | Chio .................. H01L 27/156 |

FOREIGN PATENT DOCUMENTS

| | | |
|---|---|---|
| CN | 107482031 A | 12/2017 |
| JP | 2008177168 A | 7/2008 |
| KR | 20180044465 A | 5/2018 |
| KR | 20180052977 A | 5/2018 |
| KR | 101890582 B1 | 8/2018 |
| WO | WO-2010123809 A2 | 10/2010 |
| WO | WO-2018122355 A1 | 7/2018 |
| WO | WO-2020047271 A1 | 3/2020 |

OTHER PUBLICATIONS

"International Application Serial No. PCT/US2019/048835, Written Opinion dated Nov. 22, 2019", 5 pgs.
"Taiwan Application Serial No. 108131014, Office Action dated Jul. 15, 2020", w/o English Translation, 9 pgs.
Dai, Xingliang, et al., "Quantum-Dot Light-Emitting Diodes for Large-Area Displays: Towards the Dawn of Commercialization", Advanced Materials, URL: www.advmat.de, (2017), 22 pgs.
Prins, Ferry, et al., "Direct Patterning of Colloidal Quantum-Dot Thin Films for Enhanced and Spectrally Selective Out-Coupling of Emission", Nano Letters, (Jan. 25, 2017), 25 pgs.
Qasim, Khan, et al., "Quantum Dots for Light Emitting Diodes", Journal of Nanoscience and Nanotechnology, vol. 13, (2013), 3173-3185.
Ra, Yong-Ho, et al., "Full-Color Single Nanowire Pixels for Projection Displays", Nano Letters, (Jun. 22, 2016), 25 pgs.
Shields, Andrew J., "Semiconductor quantum light sources", Nature Photonics, vol. 1, (Apr. 2007), 215-223.
Steckel, Jonathan S., et al., "Quantum dots: The ultimate down-conversion material for LCD displays", Journal of the Society for Information and Display,, (2015), 12 pgs.
Wang, Li, "Gallium Nitride-Based Electronic and Optoelectronic Devices", PhD Dissertation, Penn. State University, (May 2015), 168 pgs.
Wood, Vanessa, et al., "Inkjet-Printed Quantum Dot—Polymer Composites for Full-Color AC-Driven Displays", Advanced Materials, URL: www.advmat.de, (2009), 5 pgs.
Xie, Bin, et al., "Quantum Dots-Converted Light-Emitting Diodes Packaging for Lighting and Display: Status and Perspectives", Journal of Electronic Packaging, (2016), 17 pgs.
Yi, Liu, "Application of Quantum Dots as Down Conversion Materials in white LED", International Journal of Engineering Inventions, vol. 6, No. 1, (Jan. 2016), 07-12.
"Taiwan Application Serial No. 108131014, Response filed Oct. 12, 2020 to Office Action dated Jul. 15, 2020", w/ English Claims, 44 pgs.
"International Application Serial No. PCT/US2019/048835, International Preliminary Report on Patentability dated Mar. 11, 2021", 8 pgs.

* cited by examiner

MONOLITHICALLY INTEGRATED NANOEMITTER LIGHT SOURCE ASSEMBLY

CLAIM OF PRIORITY

This application claims the benefit of priority of U.S. Provisional Patent Application Ser. No. 62/724,826, titled "MONOLITHICALLY INTEGRATED NANOEMITTER LIGHT SOURCE ASSEMBLY" to Mohamed Azize et al., filed on Aug. 30, 2018, the entire contents of which being incorporated herein by reference.

FIELD OF THE DISCLOSURE

This document pertains generally, but not by way of limitation, to light source apparatuses and methods.

BACKGROUND

Diodes can be used as a light source for many optical applications. In some applications, laser diodes can be used due to their ability to generate a great deal of light. Other diodes (e.g., light-emitting diodes) or electrically-driven light sources can be used. Diodes can emit light as a function of the current conducted through the diode.

The primary colors red (R), blue (B) and green (G) can be combined in various amounts to make numerous other colors. In an electronic display, the primary colors can be found in an RGB color matrix. Different display technologies include liquid crystal displays (LCD), organic light emitting diode (LED) devices (OLEDs), micro-LEDs, LEDs, and plasma. The dominant technologies include LCD and OLED technology despite the high potential of micro-LEDs.

SUMMARY OF THE DISCLOSURE

This disclosure is directed to, among other things, low-cost and high-efficiency monolithically integrated nanoscale-based light emitter techniques that can be used in, for example, electronic display applications and spectroscopy applications using spectrometers. Using various techniques of this disclosure, a light emitter can include quantum dots (QDs) and can be arranged to emit light in mono-band (e.g., one wavelength) or in broad-band (e.g., more than one wavelength) such as in the visible to mid-infrared range, e.g., from about 365 nm to about 10 µm. The light emitter nanotechnology described can be based on a nanoscale wafer manufacturing for displays and spectroscopy applications.

In some aspects, this disclosure is directed to a monolithically integrated assembly of nanoemitters of light having at least one specified emission wavelength in response to at least one input wavelength generated in the assembly, the assembly comprising: a light emitter configured to generate light in the assembly at the at least one input wavelength in response to an electrical input signal; and a plurality of nanoemitters, configured to receive light from the light emitter, an individual one of the nanoemitters including: a waveguide, including a waveguiding dimension sized to be capable of receiving and guiding light at the at least one input wavelength; a quantum dot arrangement, arranged to receive the at least one input wavelength of light and, in response, to generate responsive light; and a light filter, arranged to receive the responsive light from the quantum dot arrangement and, in response, to emit light from the assembly at a specified emission wavelength and to block light at the at least one input wavelength.

In some aspects, this disclosure is directed to a monolithically integrated assembly of nanoemitters of light having at least one specified emission wavelength in response to at least one input wavelength generated in the assembly, the assembly comprising: means for generating light in the assembly at the at least one input wavelength in response to an electrical input signal; and means for receiving light from the means for generating light and to emitting light from the assembly at a specified emission wavelength and to block light at the at least one input wavelength.

In some aspects, this disclosure is directed to a method of generating at least one specified emission wavelength in response to at least one input wavelength generated in a monolithically integrated assembly of nanoemitters, the method comprising: generating light in the assembly at the at least one input wavelength in response to an electrical input signal, and receiving, by the nanoemitters, light from the light emitter, the receiving including: receiving and guiding light at the at least one input wavelength; receiving the at least one input wavelength of light and, in response, generating responsive light; and receiving the responsive light and, in response, emitting light from the assembly at a specified emission wavelength and blocking light at the at least one input wavelength.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
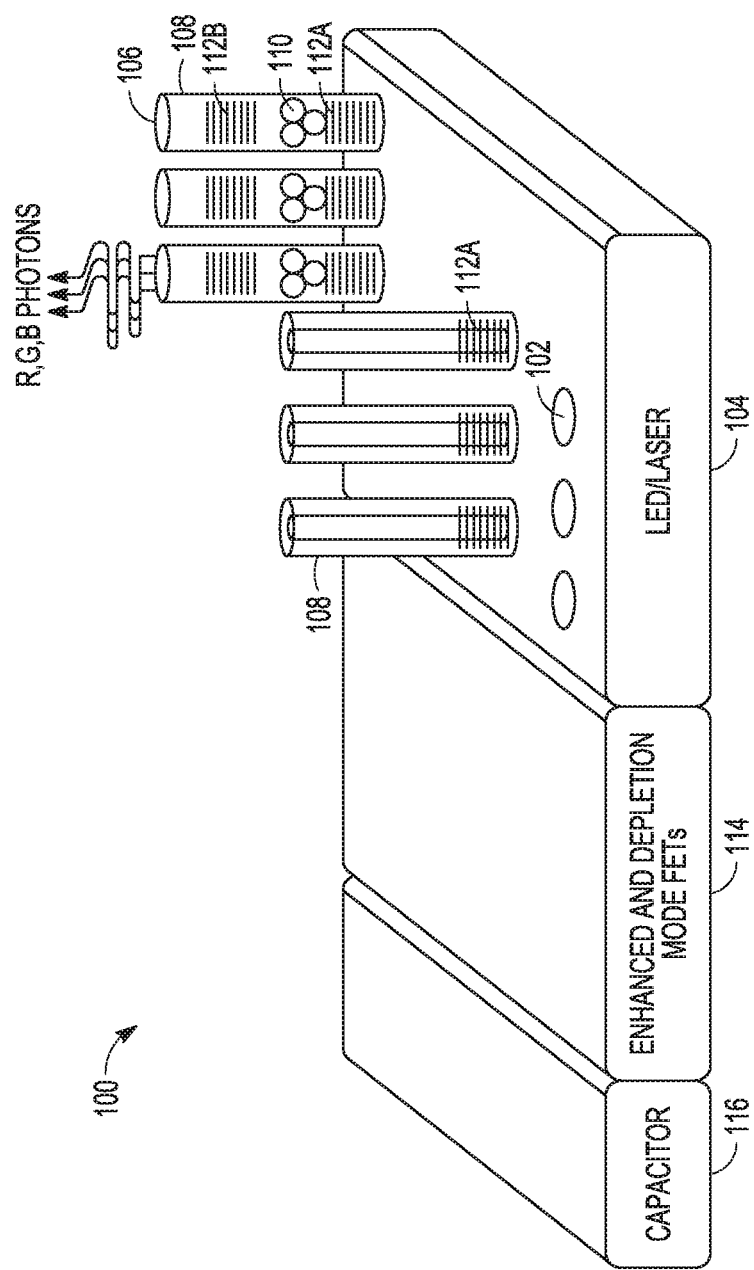
FIG. 1 is a conceptual diagram depicting an example of a monolithically integrated assembly of nanoemitters of light in accordance with this disclosure.

The primary colors red (R), blue (B) and green (G) can be combined in various amounts to make numerous other colors. In an electronic display, the primary colors can be found in an RGB color matrix. Different display technologies include liquid crystal displays (LCD), organic light emitting diode (LED) devices (OLEDs), micro-LEDs, LEDs, and plasma. The dominant technologies include LCD and OLED technology despite the high potential of micro-LEDs. Various advantages of micro-LEDs include high energy efficiency, high resolution, high brightness, and low-power consumption.

The display market has not yet adopted micro-LED technology due, for example, to its high cost (e.g., low-yield and non-automated manufacturing path) and some technology road-blocks (e.g., poor external and internal quantum efficiency).

In miniature spectroscopy, a need exists for a small form-factor light source at low-cost with high energy efficiency that covers the visible to mid-infrared range. Presently, an alternative solution utilizes visible LEDs covered by infrared (IR) phosphor (e.g., using a down-conversion principle). Such a solution can have poor performance, reliability issues, and the wavelength emission covers about 650 nanometers (nm) to about 1 micrometer (μm).

This disclosure describes low-cost and high-efficiency monolithically integrated nanoscale-based light emitter techniques that can be used in, for example, electronic display applications and spectroscopy applications using spectrometers. Using various techniques of this disclosure, a light emitter can include quantum dots (QDs) and can be arranged to emit light in mono-band (e.g., one wavelength) or in broad-band (e.g., more than one wavelength) such as in the visible to mid-infrared range, e.g., from about 365 nm to about 10 μm. The light emitter nanotechnology described can be based on a nanoscale wafer manufacturing for displays and spectroscopy applications.

As described in more detail below, an assembly of light of this disclosure can include a plurality of nanoemitters monolithically integrated on the same wafer. For example, the nanoemitters can include one type or more than one type of QDs, e.g., different materials and different diameter QDs. In some non-limiting example configurations, the diameter of the nanoemitter can range from about 10 nm to about 500 μm. The assembly can include multiple doped and undoped wide-bandgap layers. For example, the base scheme of the device structure can be a tri-layer semiconductor.

In some example configurations, light filters, e.g., distributed Bragg reflectors (DBRs) at one or both ends of a nanoemitter can be used as a filter or resonator. The nanoemitters can emit light once pumped by a light emitter, e.g., an LED, laser, or natural sun light, e.g., using down-conversion techniques. In some example configurations, flat lenses can be deposited on the top of the nanoemitters to improve extraction and the collimation of the extracted/emitted light.

In some example configurations, the assembly can include a transistor monolithically integrated on the same wafer. The transistor can be an enhanced mode transistor or a depletion mode transistor that can use wide bandgap material such as high electron mobility transistor (HEMT), e.g., AlGaN/GaN.

In some example configurations, the assembly can include a capacitor structure monolithically integrated on the same wafer. For example, the capacitor structure can utilize metal-oxide-semiconductor (MOS), metal-insulator-semiconductor (MIS), metal-oxide-metal (MOM), or metal-insulator-metal (MIM) techniques.

FIG. 1 is a conceptual diagram depicting an example of a monolithically integrated assembly 100 of nanoemitters of light in accordance with this disclosure. The nanoemitters of light can have one or more specified emission wavelengths in response to one or more input wavelengths generated in the assembly. As seen in FIG. 1, one or more quantum dot openings 102 can be defined on a light emitter 104, such as an LED or laser. The light emitter 104 can be configured to generate light in the assembly 100 at the input wavelength(s) in response to an electrical input signal.

Over the quantum dot opening, one or more nanoemitters 106 can be formed. Each nanoemitter 106 can include a waveguide 108 constructed to have appropriate dimensions to receive and guide light at one or more wavelengths generated by the light emitter 104. For example, in a configuration using a blue LED as the light emitter 104, the waveguide 108 can be constructed to receive and guide light at a wavelength between about 450-500 nm, which is an approximate range of wavelengths for blue light.

Each nanoemitter 106 can include a quantum dot arrangement 110 of one or more groups of quantum dots, e.g., visible and IR emitters. Each quantum dot arrangement 110 can be arranged to receive the input wavelength(s) of light from the light emitter, e.g., LED or laser, and, in response, to generate responsive light, e.g., red light, blue light, green light, etc.

In the non-limiting example shown in FIG. 1, each nanoemitter 106 can include a quantum dot arrangement 108 with three different types of quantum dots arranged to generate light at three different corresponding wavelengths to produce red, green, and blue light. In the configuration shown in FIG. 1, the three different types of quantum dots can be used to produce white (broad-band) emissions. In other configurations and as described below, each nanoemitter can include only one type of quantum dot so as to generate light at only a single wavelength, e.g., red light.

Each nanoemitter 106 can include one or more light filters at one or both ends of the nanoemitter that can be used as a filter or resonator. For example, the light emitter can include one or both of a first DBR 112A, e.g., "DBR1" in FIG. 1, at a first end of the nanoemitter 106 and a second DBR 112B, e.g., "DBR2" in FIG. 1, at a second end of the nanoemitter 106. For example, DBR2 can be arranged to receive the responsive light from a quantum dot arrangement 110 and, in response, emit light from the assembly at a specified emission wavelength, e.g., red light, and to block light at the input wavelength(s), e.g., blue light generated by a blue LED used as a light emitter 104.

In the example configuration shown in FIG. 1, the monolithically integrated wafer can include one or more transistors 114. The transistors 114 can be enhancement mode or depletion mode transistors. The transistors 114 can include, for example, inorganic transistors, organic transistors, field-effect transistors (FETs), organic blue FETs, metal-semiconductor field-effect transistors (MESFETs), metal-insulator-semiconductor field-effect transistors (MISFETs), metal-oxide-semiconductor field-effect transistor (MOSFETs), and metal-insulator-semiconductor high electron mobility transistors (MISHEMTs). As described below, each nanoemitter 106 can be coupled to a corresponding transistor arranged to selectively control light emission from the nanoemitter in response to a control signal received by the transistor, e.g., a voltage applied to a gate of a FET or FET-type of transistor.

In addition, the monolithically integrated wafer can include one or more capacitors 116. The capacitor 116 can be, for example, a metal-insulator-semiconductor (MIS) capacitor, a metal-oxide-semiconductor (MOS) capacitor, and a metal-oxide-metal (MOM) capacitor.

Figure 2:
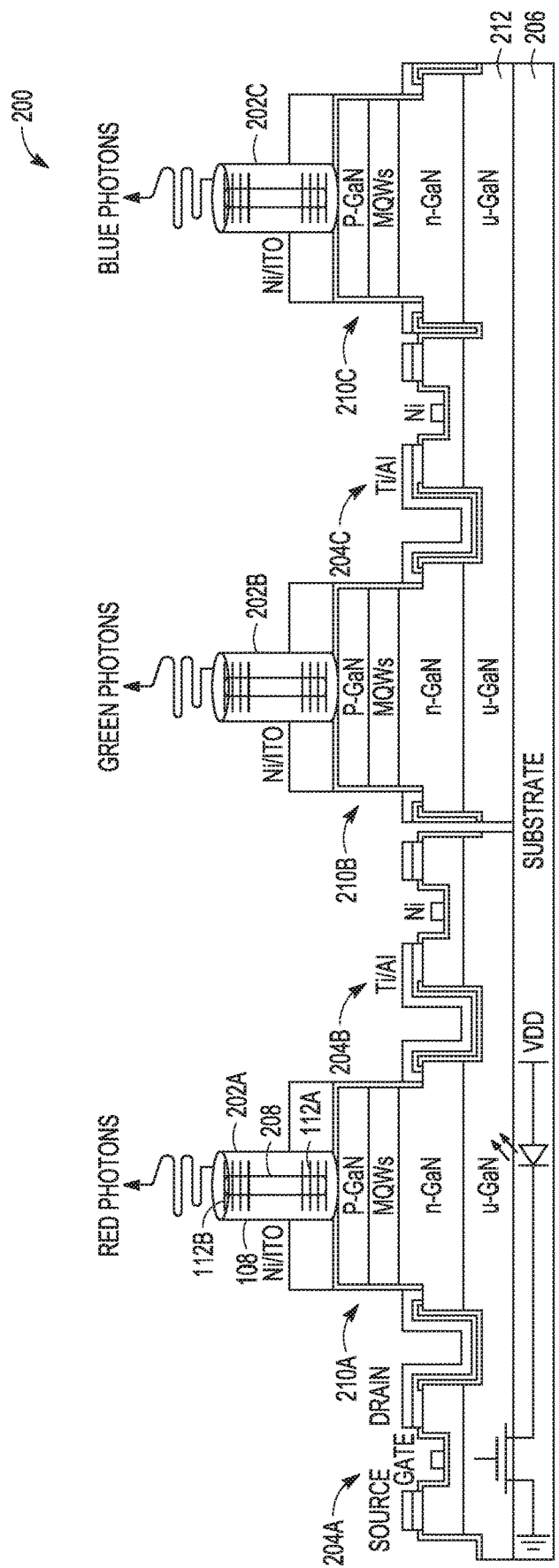
FIG. 2 is a conceptual diagram depicting another example of a monolithically integrated assembly of nanoemitters of light in accordance with this disclosure.

FIG. 2 is a conceptual diagram depicting another example of a monolithically integrated assembly of nanoemitters of light in accordance with this disclosure. The assembly 200 of FIG. 2 depicts three (3) nanoemitters 202A, 202B, and 202C and their corresponding transistors 204A, 204B, and 204C formed on a substrate 206. In the non-limiting example shown, the nanoemitter 202A can be configured to emit red photons, the nanoemitter 202B can be configured to emit green photons, and the nanoemitter 202C can be configured to emit blue photons. For purposes of conciseness, only one nanoemitter will be described with respect to FIG. 2, namely the nanoemitter 202A.

As mentioned above, the nanoemitter 202A can include a waveguide 108, a quantum dot arrangement 208, and one or more light filters 112A, 112B. In the example shown in FIG. 2, the nanoemitters can be positioned within a quantum dot hole defined at least partially by a semi-transparent metal, e.g., nickel and indium-tin-oxide.

The assembly 200 can further include a light emitter, such as an LED 210A. The LED 210A can be formed using III-V semiconductors (such as various gallium nitride (GaN) layers) or II-VI semiconductors in which the light emitter emission of QDs can be superior to the LED light emitter emissions. For example, in the particular non-limiting example shown in FIG. 2, the LED 210A can include a p-GaN layer, a multiple quantum well (MQW) layer, and a n-GaN contact layer. In some example implementations, the LED can be a blue LED. The LED 210A can be formed over a buffer layer 212, such as a u-GaN layer, and a substrate 206, such as sapphire.

As mentioned above, each light emitter, e.g., LED 210A, can have a corresponding transistor, e.g., transistor 204A, arranged to selectively control light emission from the nanoemitter, e.g., nanoemitter 202A, in response to a control signal received by the transistor. The transistor 204A can be FET transistor having a gate, drain, and source terminals, as shown, with the drain terminal electrical coupled to the n-GaN contact layer of the LED 210A, for example.

Similarly, the nanoemitters 202B and 202C can be selectively controlled by corresponding transistors 204B and 204C.

Figure 3:
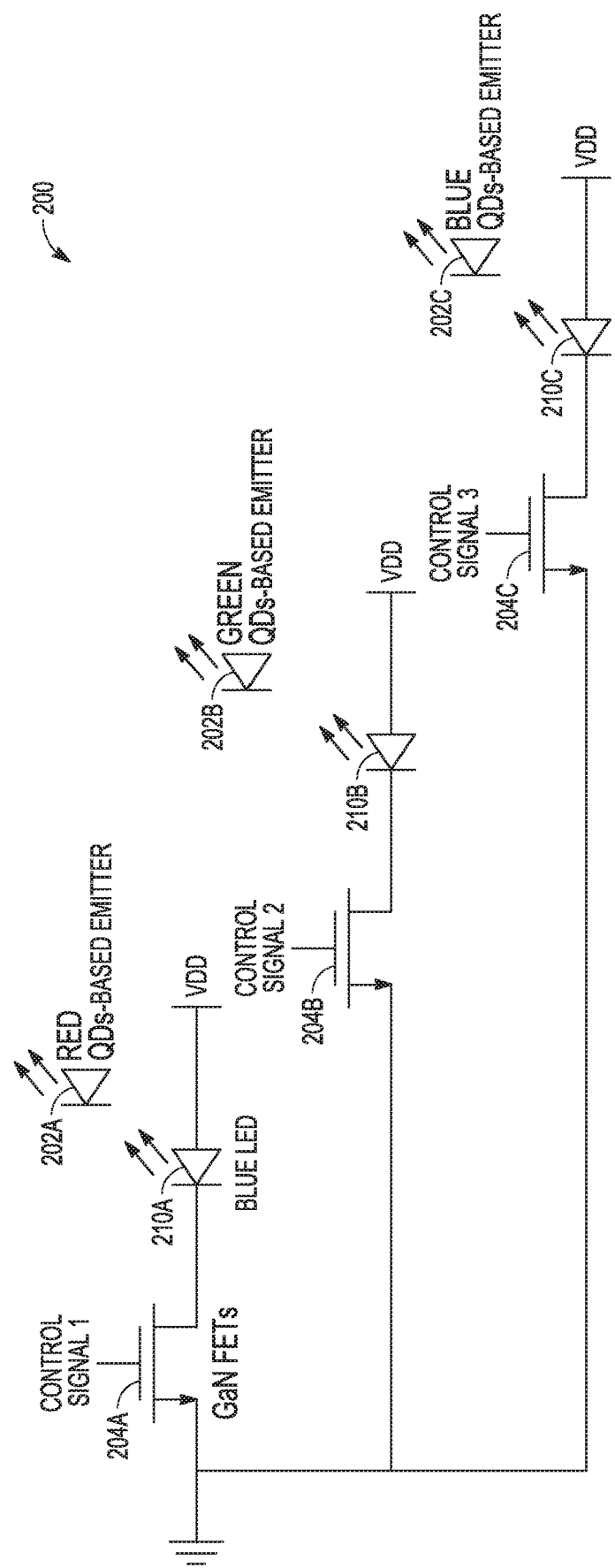
FIG. 3 is a schematic diagram representing the conceptual diagram of FIG. 2.

FIG. 3 is a schematic diagram representing the conceptual diagram of FIG. 2. The monolithically integrated assembly 200 of FIG. 3 can include transistors 204A-204C, light emitters 210A-210C, and nanoemitters 202A-202C.

In some example configurations, such as when using enhancement mode transistors, when a transistor, e.g., transistor 204A, receives a control signal, e.g., the control signal 1, the transistor can turn ON. In FIG. 3, the drain of each transistor is coupled to the n-GaN contact layer of a corresponding light emitter, e.g., LED or laser. When the transistor turns ON, an LED, for example, can become forward biased, which can allow electrons from a conduction band to recombine with holes from a valence band and release sufficient energy to produce light at one or more wavelengths. For example, a blue LED 210A can produce light at a wavelength between about 450-500 nm.

A nanoemitter, e.g., the nanoemitter 202A, can receive the light produced by the light emitter, e.g., LED 210A, and emit light at a specified emission wavelength. For example, the nanoemitter 202A can receive blue light generated by the blue LED 210A. Using its waveguide, quantum dot arrangement, and one or more light filters, such as described above, the nanoemitter 202A can emit light from the assembly 200 at a specified emission wavelength and block light at one or more input wavelengths. For example, the nanoemitter 202A can include a quantum dot arrangement configured to produce red light and can include a light filter, e.g., DBR, configured to permit the emission of the red light but block any blue light from the blue LED 210A. In this manner, the transistor 204A can selectively control light emission, e.g., red light emission, from the nanoemitter in response to a control signal received by the transistor.

The transistors 204B and 204C can similarly selectively control light emission from their corresponding nanoemitters 202B and 202C in response to control signals received by the transistors 204B and 204C. For example, in an enhancement mode configuration and in response to the control signal 2, the transistor 204B can turn ON, thereby forward biasing the LED 210B and causing the nanoemitter 202B to emit green light, for example. Similarly, in response to the control signal 3, the transistor 204C can turn ON, thereby forward biasing the LED 210C and causing the nanoemitter 202C to emit blue light, for example.

As mentioned above, in some examples, the quantum dot arrangements of the nanoemitters can produce a single specified emission wavelength, e.g., red light. In other examples, it may be desirable for a nanoemitter to be configured to produce more than one specified emission wavelengths. As such, each nanoemitter can include at least a first group of quantum dots configured to produce a first single specified emission wavelength, e.g., red light, and a second group of quantum dots configured to produce a second single specified emission wavelength, e.g., green light. Such a nanoemitter can include multiple light filters to block unwanted emission wavelengths. In some configurations, each nanoemitter can include a third group of quantum dots configured to produce a third single specified emission wavelength, e.g., blue light. Together, the three groups of RGB quantum dots can produce numerous colors.

The techniques described above with respect to FIGS. 2 and 3 can be used for electronic displays, for example. Electronic displays can use mono-band colors (red, green, and blue). In some example configurations, the light filters of FIG. 2, for example, can be configured to allow only red, green, or blue for each a corresponding nanoemitter.

The nanoemitter techniques of this disclosure can also be applicable to spectrometers. It can be desirable for spectrometers to use broad-band emissions, e.g., multiple wavelengths emitted at the same time. In such applications, it can be desirable for any light filters, e.g., DBRs, to allow a range of wavelengths to pass, rather than a single wavelength. For spectroscopy applications, the quantum dots can be a mixture of different types and sizes, e.g., diameter sizes, of quantum dots inserted in the same nanoemitters or having multiple nanoemitters with a specific quantum dots in order to get a broad band emission. Examples diagrams for spectroscopy applications are shown and described below with respect to FIGS. 4 and 5.

Figure 4:
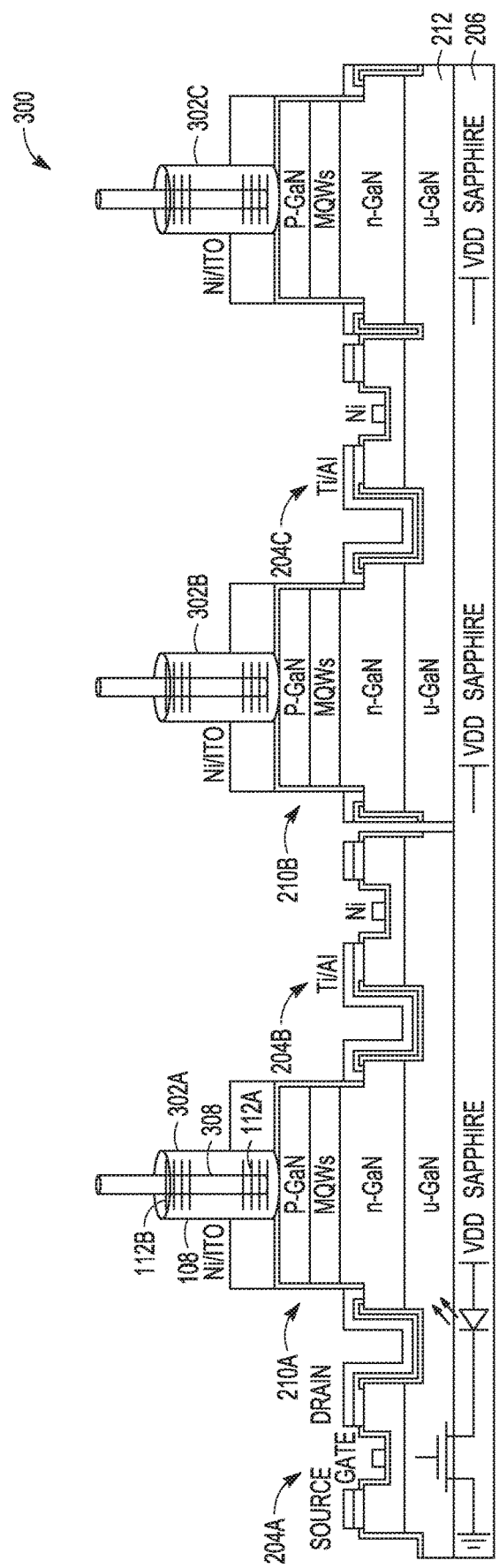
FIG. 4 is a conceptual diagram depicting another example of a monolithically integrated assembly of nanoemitters of light in accordance with this disclosure.

FIG. 4 is a conceptual diagram depicting another example of a monolithically integrated assembly of nanoemitters of light in accordance with this disclosure. The assembly 300 of FIG. 4 depicts three (3) nanoemitters 302A, 302B, and 302C and their corresponding transistors 204A, 204B, and 204C formed on a substrate 206. In the non-limiting example shown, each of the nanoemitters 302A-302C can be configured to emit broad-band colors, e.g., multiple wavelengths emitted at the same time. For purposes of conciseness, only one nanoemitter will be described with respect to FIG. 4, namely the nanoemitter 302A.

As described above, the nanoemitter 302A can include a waveguide 108, a quantum dot arrangement 308, and one or more light filters 112A, 112B. For spectroscopy applications, the quantum dots can be a mixture of different types and sizes, e.g., diameter sizes, of quantum dots inserted in the same nanoemitters or having multiple nanoemitters with a specific quantum dots in order to get a broad band emission. It can be desirable for the light filters 112A, 112B, e.g., DBRs, to allow a range of wavelengths to pass, rather than a single wavelength. In the example shown in FIG. 4, the nanoemitters can be positioned within a quantum dot hole defined at least partially by a semi-transparent material, e.g., metal such as indium-tin-oxide.

The assembly 300 can further include a light emitter, such as an LED 210A. The LED 210A can be formed using various gallium nitride (GaN) layers. For example, in the particular non-limiting example shown in FIG. 4, the LED 210A can include a p-GaN layer, InGaN/GaN multiple quantum well (MQW) layers, and a n-GaN contact layer. In some example implementations, the LED can be a blue LED. The LED 210A can be formed over a buffer layer 212, such as a u-GaN layer, and a substrate, such as sapphire.

As mentioned above, each light emitter, e.g., LED 210A, can have a corresponding transistor, e.g., transistor 204A, arranged to selectively control light emission from the nanoemitter, e.g., nanoemitter 302A, in response to a control signal received by the transistor. The transistor 204A can be FET transistor having a gate, drain, and source terminals, as shown, with the drain terminal electrical coupled to the n-GaN contact layer of the LED 210A, for example.

Similarly, the nanoemitters 302B and 302C can be selectively controlled by corresponding transistors 204B and 204C.

Figure 5:
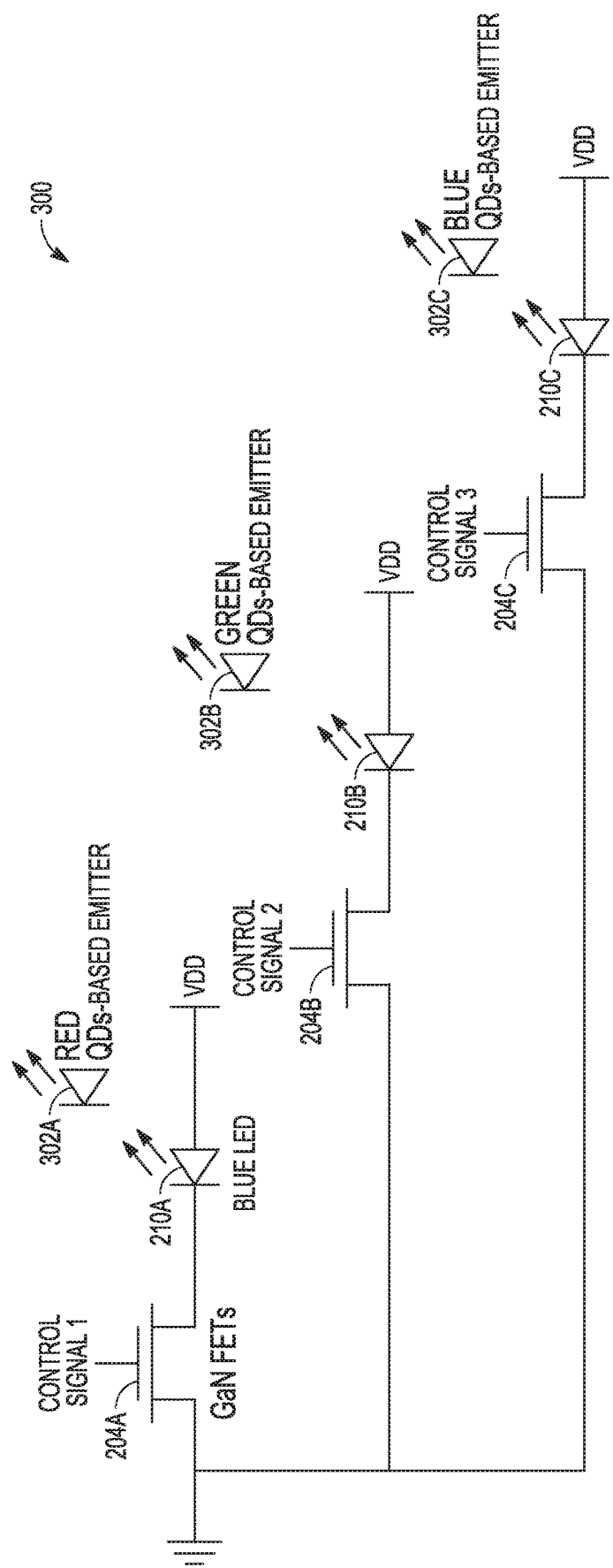
FIG. 5 is a schematic diagram representing the conceptual diagram of FIG. 4.

FIG. 5 is a schematic diagram representing the conceptual diagram of FIG. 4. The monolithically integrated assembly 300 of FIG. 5 can include transistors 204A-204C, light emitters 210A-210C, and nanoemitters 302A-302C.

In some example configurations, such as when using enhancement mode transistors, when a transistor, e.g., transistor 204A, receives a control signal, e.g., the control signal 1, the transistor can turn ON. In FIG. 5, the drain of each transistor is coupled to the n-GaN contact layer of a corresponding light emitter, e.g., LED or laser. When the transistor turns ON, an LED, for example, can become forward biased, which can allow electrons from a conduction band to recombine with holes from a valence band and release sufficient energy to produce light at one or more wavelengths. For example, a blue LED 210A can produce light at a wavelength between about 450-500 nm.

A nanoemitter, e.g., the nanoemitter 302A, can receive the light produced by the light emitter, e.g., LED 210A, and emit light at a specified emission wavelength. For example, the nanoemitter 302A can receive blue light generated by the blue LED 210A. Using its waveguide, quantum dot arrangement, and one or more light filters, such as described above, the nanoemitter 302A can emit light from the assembly 300 at a specified range of emission wavelengths, e.g., to produce a broad-band color emission, and block light at one or more input wavelengths. For example, the nanoemitter 302A can include a quantum dot arrangement including a mixture of different quantum dots that together can be configured to produce a range of emission wavelengths. Each nanoemitter can include a light filter, e.g., DBR, configured to permit the range of emission wavelengths but block any blue light from the blue LED 210A, for example. In other configurations, a group of nanoemitters with specific quantum dots, e.g., red, blue, green, can be used in order to provide a broad band emission. In this manner, the transistor 204A can selectively control light emission from the nanoemitter in response to a control signal received by the transistor.

The transistors 204B and 204C can similarly selectively control light emission from their corresponding nanoemitters 302B and 302C in response to control signals received by the transistors 204B and 204C. For example, in response to the control signal 2, the transistor 204B can turn ON, thereby forward biasing the LED 210B and causing the nanoemitter 302B to emit light having a range of emission wavelengths, for example. Similarly, in response to the control signal 3, the transistor 204C can turn ON, thereby forward biasing the LED 210C and causing the nanoemitter 302C to emit light having a range of emission wavelengths, for example.

A compound semiconductor used to form the semiconductor devices described herein may include a chemical compound of elements from different groups in the periodic table. Such chemical compounds may include a pairing of elements from group III (the group comprising boron (B), aluminum (Al), gallium (Ga), indium (In), and thallium (TI)) with elements from group V (the group comprising nitrogen (N), phosphorus (P), arsenic (As), antimony (Sb), and bismuth (Bi)). Group 3 of the periodic table may also be referred to as Group III and group 5 as Group V.

Without limitation, a semiconductor device may be fabricated from gallium nitride (GaN) and aluminum indium gallium nitride (AlInGaN). Additionally, a semiconductor device may be fabricated using AlN/GaN/AlN hetero-structures, InAlN/GaN, GaN/AlGaN, or other combinations of group 13 and group 15 elements. These hetero-structures may form a two-dimensional electron gas (2DEG) at the interface of the compound semiconductors that form heterostructure, such as the interface of GaN and AlGaN. The 2DEG may form a conductive channel of electrons that may be controllably depleted, such as by gate voltage metal contact disposed above the channel, to control a current through the semiconductor device.

In an example, the semiconductor device may be a field effect transistor, such as a high electron mobility transistor (HEMT), having source and drain terminals electrically coupled to a channel formed by a 2DEG, and a gate terminal disposed above the channel. A voltage on the gate terminal, determined relative to a voltage on the drain terminal, may induce an electric field into the channel to control the concentration of free electrons in the 2DEG, such as to control a flow of current through the transistor.

Figure 6A:
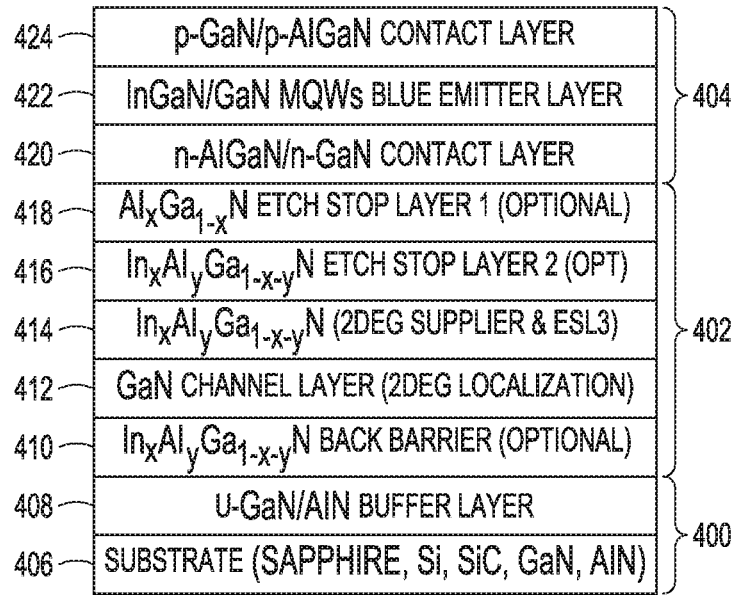
FIGS. 6A-6K depict an example of a process fabrication flow to produce a monolithically integrated assembly of nanoemitters of light in accordance with this disclosure.

FIGS. 6A-6K depict an example of a process fabrication flow to produce a monolithically integrated assembly of nanoemitters of light in accordance with this disclosure. FIG. 6A depicts the starting materials that can be used in a first example flow. Generally, the layers of materials in FIG. 6A can be used to produce buffer/substrate layers 400, an HEMT structure 402 embedded into a light emitting structure, e.g., LED structure, and a light emitter 404, e.g., blue LED.

Starting at the bottom, a substrate layer 406 can be formed, e.g., sapphire, silicon (Si), silicon carbide (SiC), GaN, aluminum nitride (AlN), glass, and polymer. On top of the substrate layer 406, a buffer layer 408 can be formed, e.g., a u-GaN layer or AlN layer. Optionally, an InAlGaN back barrier 410 can be formed, e.g., using deposition or growth, on top of the buffer layer.

Next, a GaN channel layer 412 can be formed, e.g., on the optional back barrier layer 410, for 2DEG localization. Over the GaN channel layer 412, an InAlGaN layer 414 can be formed as a 2DEG supplier and etch stop layer.

Two additional (and optional) etch stop layers can be formed over layer 414. For example, an optional InAlGaN etch stop layer 416 can be formed over layer 414 and an optional AlGaN etch stop layer 418 can be formed over the InAlGaN etch stop layer 416. The layers 408-418 together can form an HEMT structure.

On top of the HEMT structure, three additional layers 420-424 can be added to form the light emitter, e.g., LED. In particular, an n-AlGaN or n-GaN contact layer 420 can be formed on the layer 418. Next, an InGaN or GaN multiple quantum well (MQW) layer 422 can be formed on the contact layer 420. Then, a p-GaN or p-AlGaN contact layer 424 can be formed on the MQW layers 422.

Figure 6B:
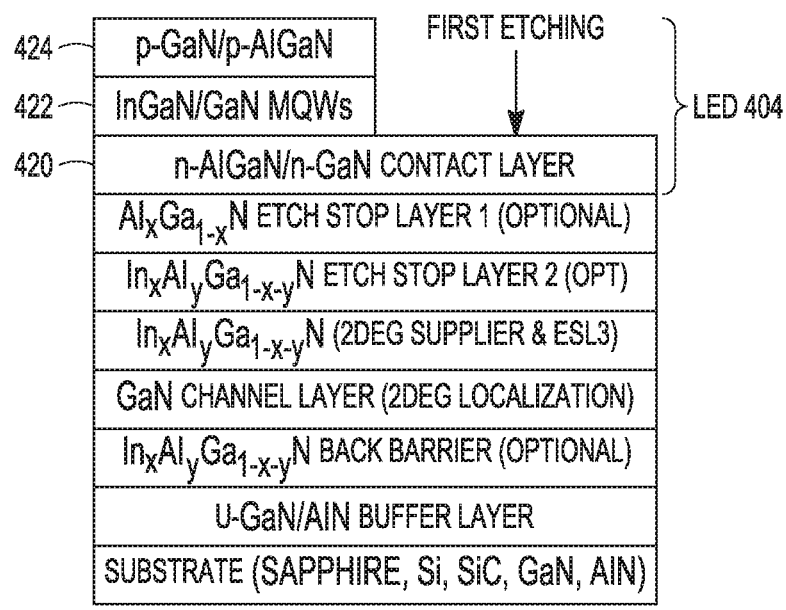

FIG. 6B depicts a first dry etching stage of the process fabrication flow. As seen in FIG. 6B, a portion of the top two layers, namely the p-contact layer 424 and the MQW layer 422 can be removed via a first etching to permit, for example, a contact to be formed on the contact layer 420.

Figure 6C:
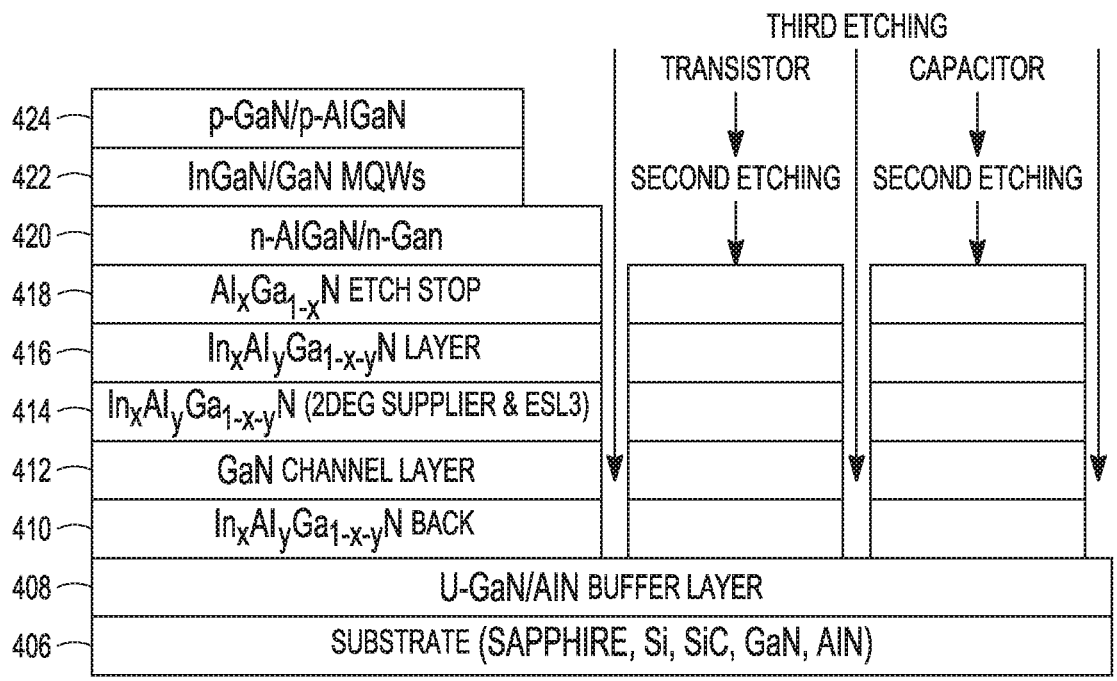

FIG. 6C depicts a second etching and a third etching of the process fabrication flow. These two etchings can be used to define a transistor and a capacitor that each corresponding to the LED 404. To begin defining a transistor and a capacitor, a second etching can remove layers 420-424. Then, a third etching can remove layers 410-418, stopping at the buffer layer 408.

Figure 6D:
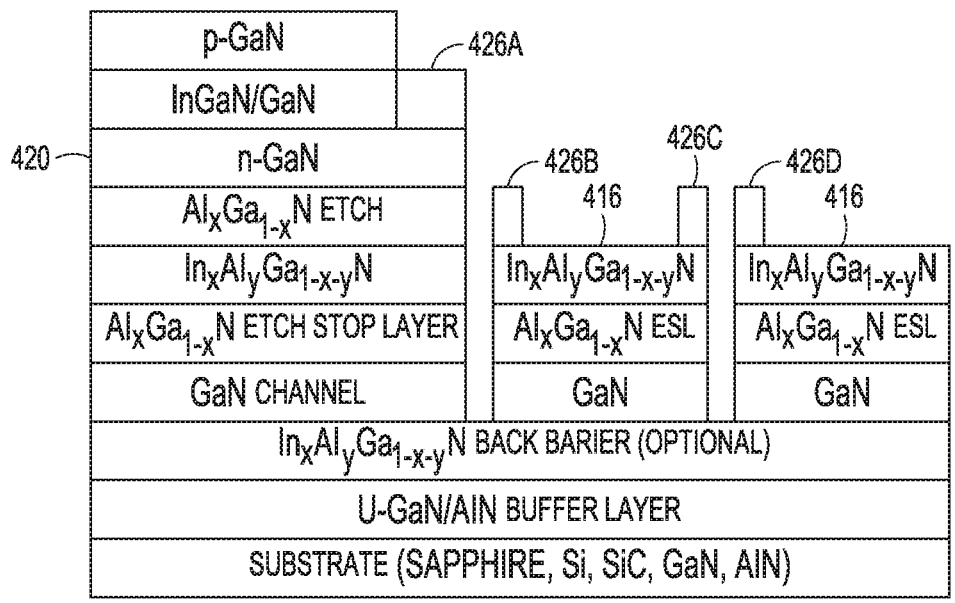

FIG. 6D depicts a formation of ohmic contacts of the process fabrication flow. Ohmic contacts 426A-426D, e.g., titanium (Ti) or gold (Au), can be formed on the contact layer 420 of the LED (e.g., forming a cathode contact) after removal of the etch stop layer 418, the layer 416 of the transistor (e.g., forming source and drain contacts), and on the layer 416 of the capacitor after removal of the etch stop layer 418.

Figure 6E:
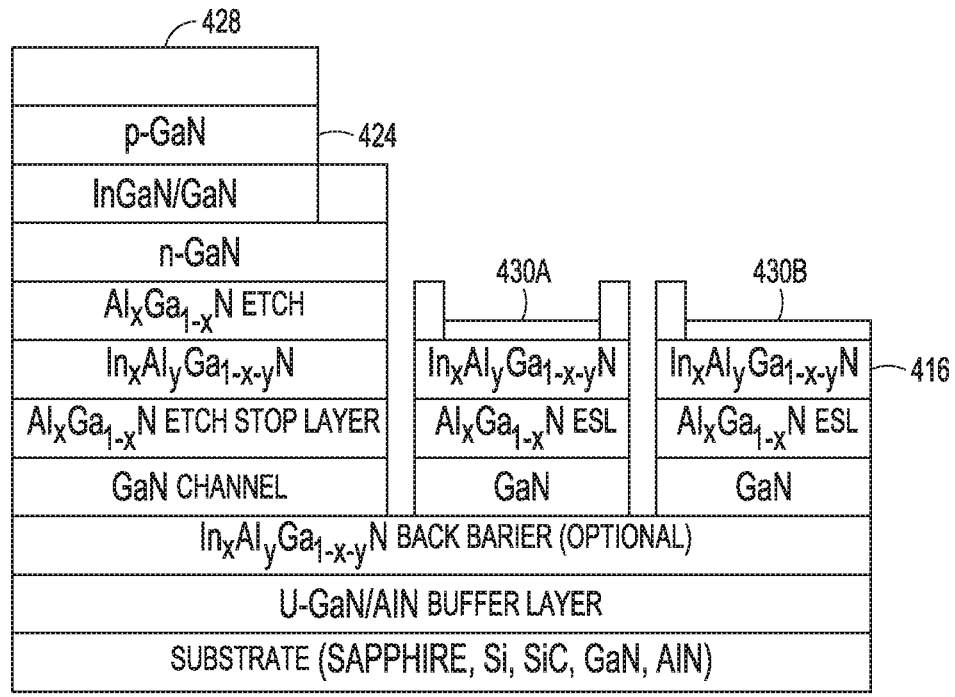

FIG. 6E depicts a formation of semi-transparent metal of the process fabrication flow. In particular, a semi-transparent metal 428, e.g., indium tin oxide (ITO), can be formed on the contact layer 424 of the LED. Optionally, dielectric layers 430A, 430B can be formed on the layer 416 of the transistor and the capacitor.

Figure 6F:
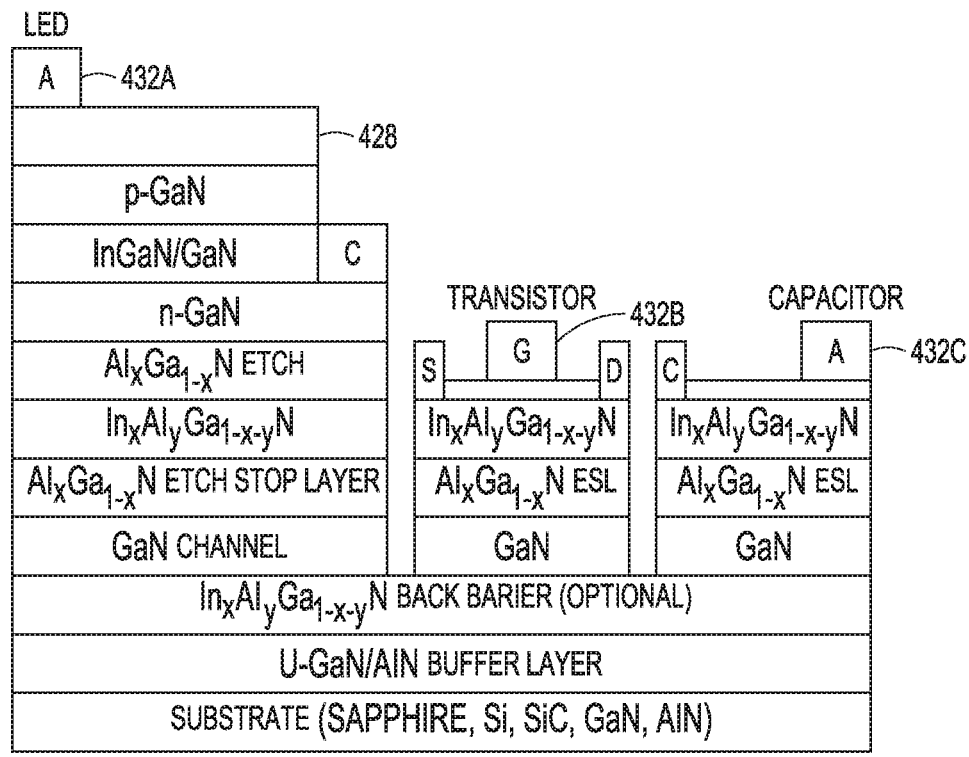

FIG. 6F depicts a formation of ohmic and gate contacts of the process fabrication flow. For example, a contact 432A, e.g., nickel (Ni) or gold (Au), can be formed on the semi-transparent metal layer 428 of the LED (e.g., forming an anode contact). Additionally, contacts 432B, 432C, e.g., Ni or Au, can be formed on the dielectric material of the transistor, e.g., forming a gate contact, and the capacitor.

Figure 6G:
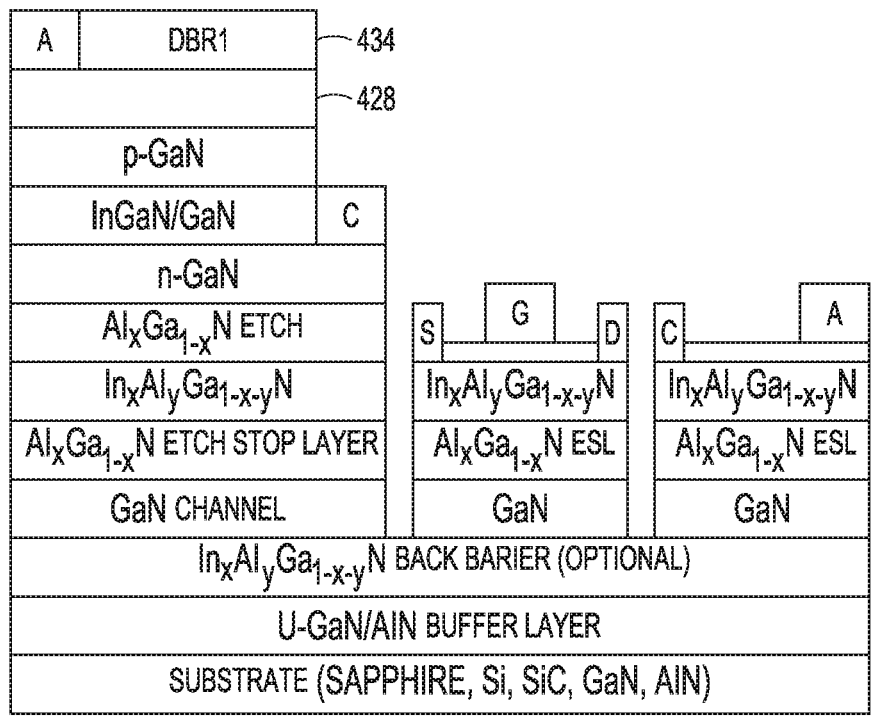

FIG. 6G depicts a formation of a first light filter of the process fabrication flow. A first light filter layer 434, e.g., a first DBR, can be formed on the semi-transparent metal layer 428 of the LED.

Figure 6H:
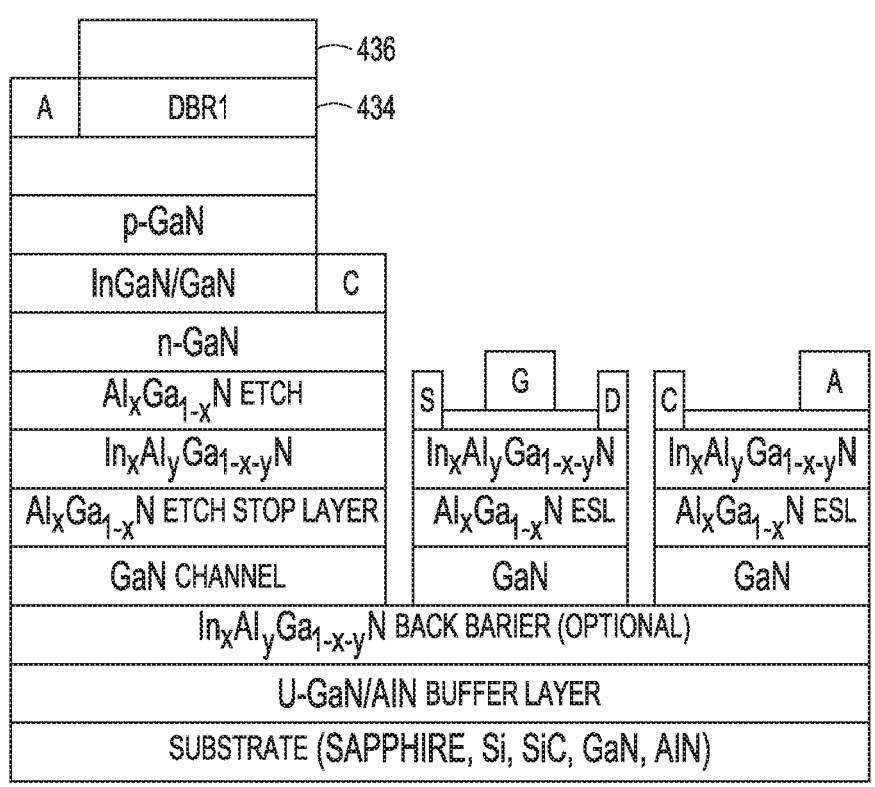

FIG. 6H depicts formation of the waveguide and quantum dots of the process fabrication flow. A waveguide and a quantum dot arrangement layer 436 can be formed on the first light filter layer 434.

Figure 6I:
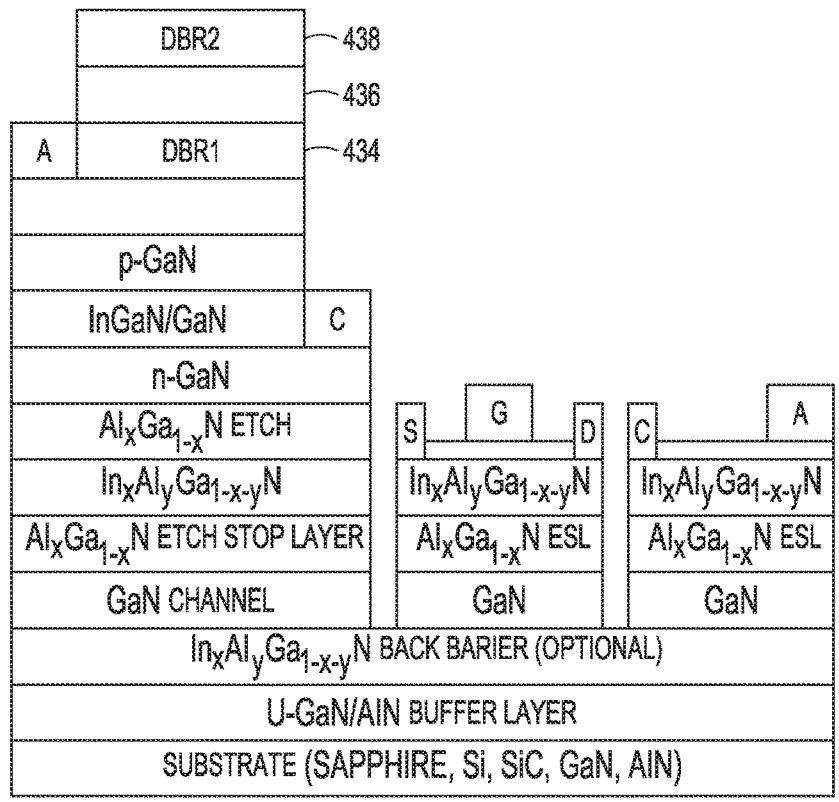

FIG. 6I depicts a formation of second light filter of the process fabrication flow. A second light filter layer 438, e.g., a second DBR, can be formed on the waveguide and a quantum dot arrangement layer 436. The second light filter layer 438 can operate as a band pass filter and pass specific wavelengths, e.g., for red light, green light, etc., while reflecting wavelength(s) of the light emitter, e.g., blue light of a blue LED.

Figure 6J:
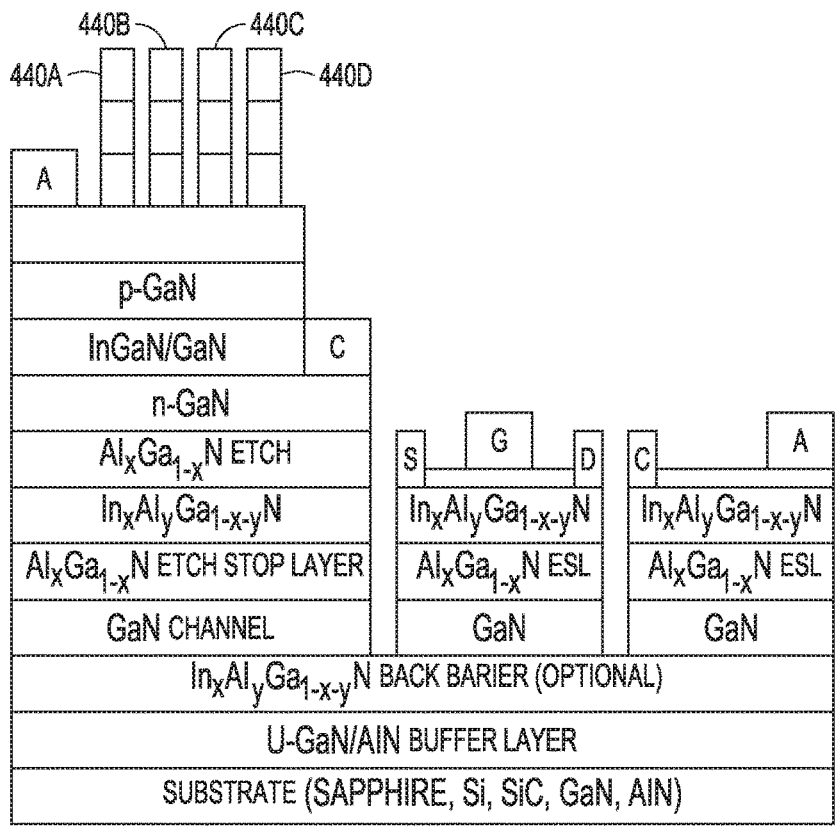

FIG. 6J depicts a formation of individual nanoemitters of the process fabrication flow. In the non-limiting example shown in FIG. 6J, four (4) individual nanoemitters 440A-440D are depicted after formation. The nanoemitters 440A-440D can be formed on a nanoscale, e.g., a diameter of between about 10 nm and about 500 μm. In some examples, the nanoemitters can be formed using a nanoscale printing system available from Nano OPS, Inc. (http://nano-ops.net). Examples of such a nanoscale printing system are described in U.S. Pat. Nos. 8,362,618; 8,937,293; 9,145,618; 9,365,946; and 9,388,047, the entire contents of each being incorporated herein by reference in its entirety. The nanoscale printing system can form the nanoemitters 440A-440D individually.

Figure 6K:
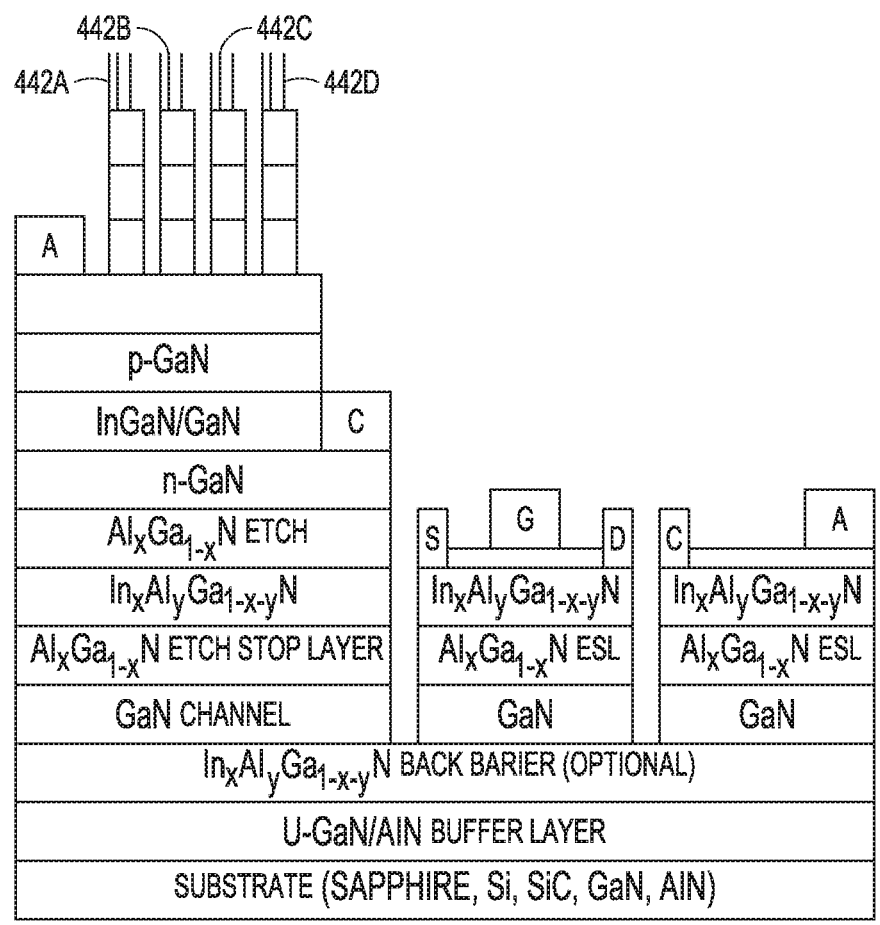

FIG. 6K depicts a formation of individual lenses of the process fabrication flow. The optional lenses 442A-442D, e.g., flat lenses, shown in FIG. 6K can be formed using the nanoscale printing system available from Nano OPS, Inc. The lenses 442A-442D, which can be positioned adjacent an end of a corresponding nanoemitter, can be configured to receive and focus the light emitted at the specified emission wavelength from the nanoemitter. The optional lenses can be made from titanium dioxide ($TiO_2$) or silicon dioxide ($SiO_2$), for example.

FIGS. 7A-7G depict another example of a process fabrication flow to produce a monolithically integrated assembly of nanoemitters of light in accordance with this disclosure. The flow of FIGS. 7A-7G can begin using the starting materials shown in FIG. 6A and the first dry etching shown in FIG. 6B.

Figure 7A:
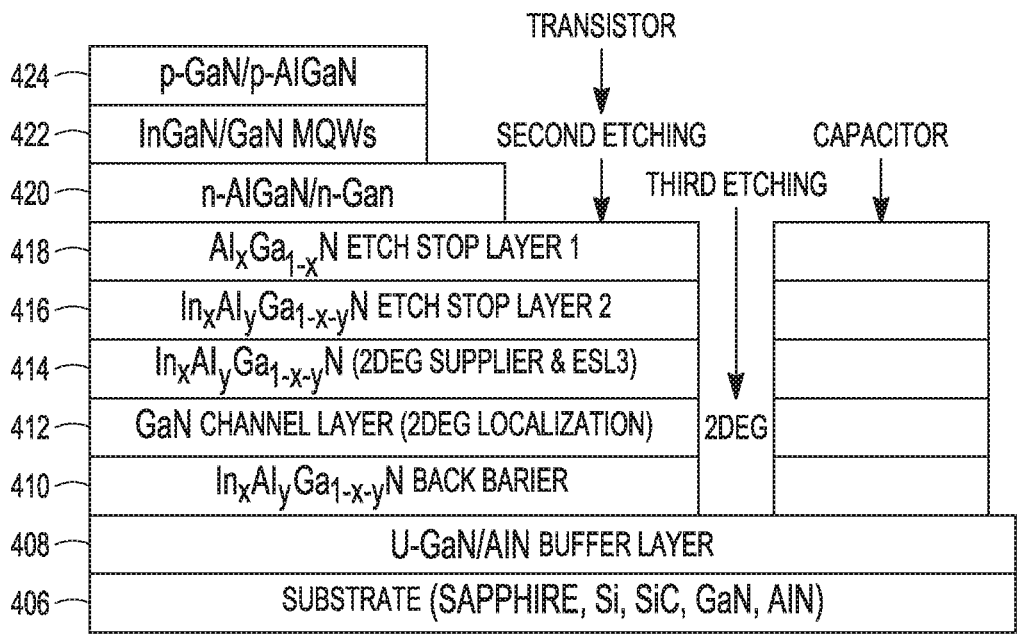
FIGS. 7A-7G depict another example of a process fabrication flow to produce a monolithically integrated assembly of nanoemitters of light in accordance with this disclosure.

FIG. 7A depicts a second etching and a third etching of the process fabrication flow. These two etchings can be used to define a transistor and a capacitor that each corresponding to the LED. To begin defining a transistor, a second etching can remove layer 420. Then, a third etching to define a capacitor can remove layers 410-418, stopping at the buffer layer 408.

An advantage of the configuration in FIG. 7A is that the cathode of the LED, e.g., the n-type layer 420, can be directly connected to the transistor via the 2DEG region. This is in contrast with the configuration of FIG. 6C in which an additional metal interconnection is used between the drain of the capacitor and the cathode of the LED.

Figure 7B:
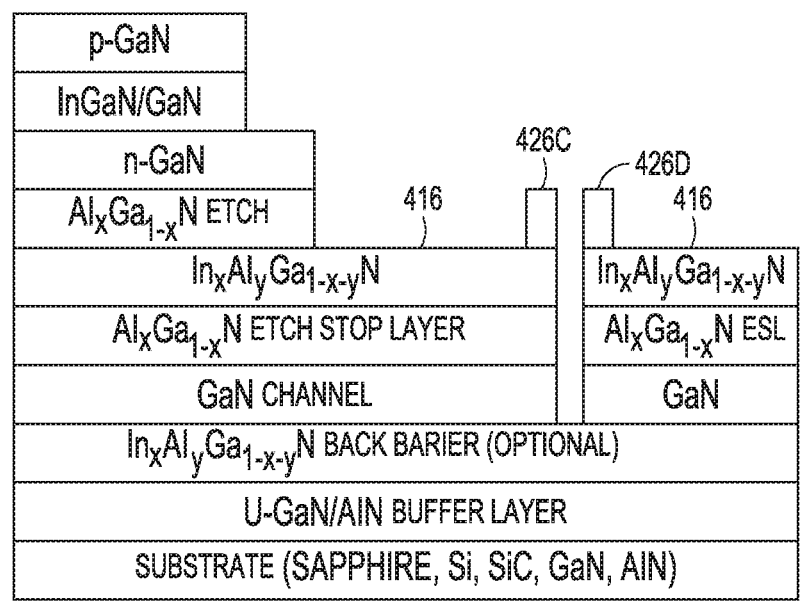

FIG. 7B depicts a formation of ohmic contacts of the process fabrication flow. Ohmic contacts 426C and 426D, e.g., titanium (Ti) or gold (Au), can be formed, respectively, on the layer 416 of the transistor (e.g., forming a drain contact) after removal of the etch stop layer 418, and on the layer 416 of the capacitor after removal of the etch stop layer 418.

Figure 7C:
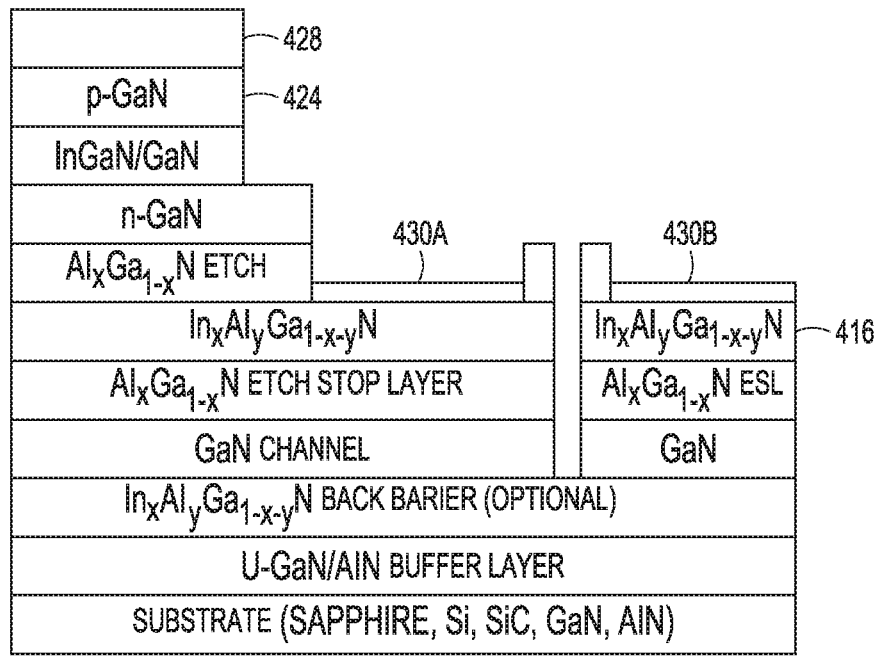

FIG. 7C depicts a formation of semi-transparent metal of the process fabrication flow. In particular, a semi-transparent metal 428, e.g., indium tin oxide (ITO), can be formed on the contact layer 424 of the LED. Optionally, dielectric layers 430A, 430B can be formed on the layer 416 of the transistor and the capacitor.

Figure 7D:
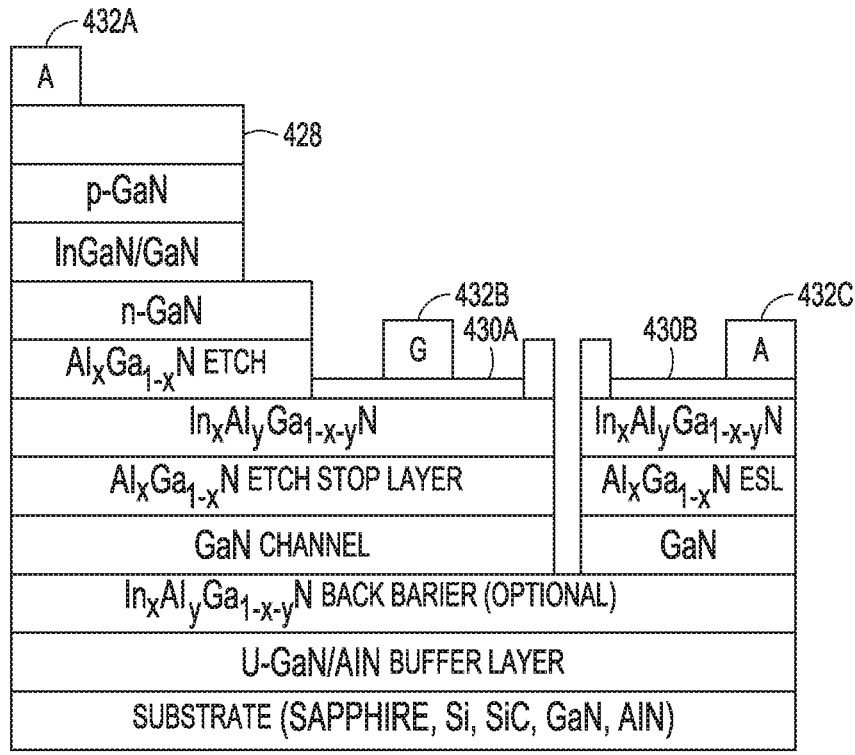

FIG. 7D depicts a formation of ohmic and gate contacts of the process fabrication flow. For example, a contact 432A, e.g., nickel (Ni) or gold (Au), can be formed on the semi-transparent metal layer 428 of the LED (e.g., forming an anode contact). Additionally, contacts 432B, 432C, e.g., Ni or Au, can be formed, respectively, on the dielectric materials 430A, 430B of the transistor, e.g., forming a gate contact, and the capacitor.

Figure 7E:
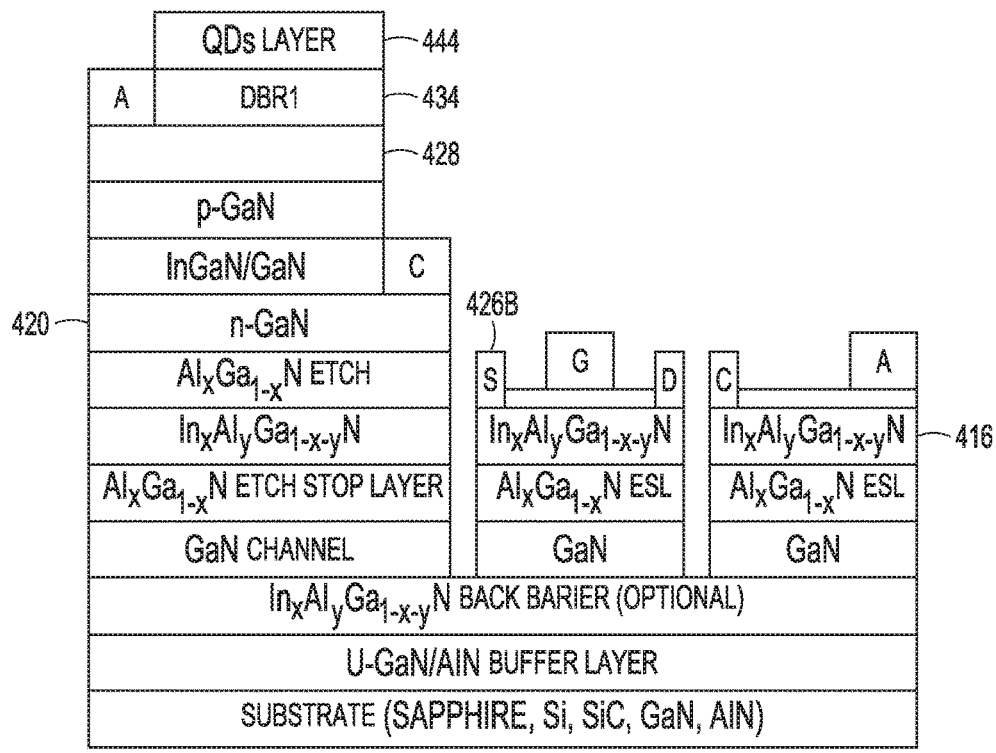

FIG. 7E depicts a formation of a first light filter of the process fabrication flow. A first light filter layer 434, e.g., a first DBR, can be formed on the semi-transparent metal layer 428 of the LED. In addition, a quantum dot arrangement layer 444 can be added over the first light filter layer 434.

After additional etching removes layers 412-416 to further define the transistor, ohmic contacts 426A, 426B, e.g., titanium (Ti) or gold (Au), can be formed, respectively, on the contact layer 420 of the LED (e.g., forming a cathode contact), and on the layer 416 of the transistor (e.g., forming a source contact).

Figure 7F:
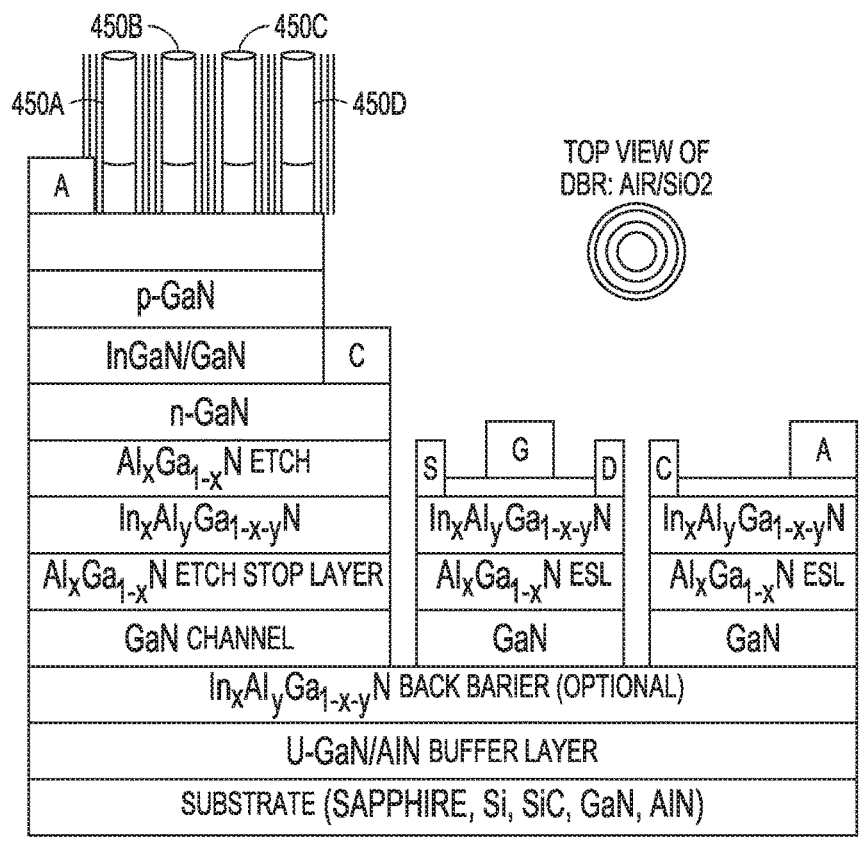

FIG. 7F depicts a top-down formation of individual nanoemitters of the process fabrication flow. In the non-limiting example shown in FIG. 7F, four (4) individual nanoemitters 450A-450D are depicted after formation. The nanoemitters 450A-450D can be formed on a nanoscale, e.g., a diameter of between about 10 nm and about 500 μm. In some examples, the nanoemitters can be formed using a nanoscale printing system available from Nano OPS, Inc. (http://nano-ops.net). Examples of such a nanoscale printing system are described in U.S. Pat. Nos. 8,362,618; 8,937,293; 9,145,618; 9,365,946; and 9,388,047, the entire contents of each being incorporated herein by reference in its entirety. The nanoscale printing system can form the nanoemitters 450A-450D individually.

The nanoscale printing system available from Nano OPS, Inc. can fabricate the waveguides and/or light filters using one or more of air, silicon dioxide ($SiO_2$), and metamaterial(s) (which can provide negative indices of refraction). In some example implementations, a waveguide can be formed with concentric layers of differing materials, such as air, silicon dioxide, and metamaterials, to provide layers of differing indices of refraction.

Figure 7G:
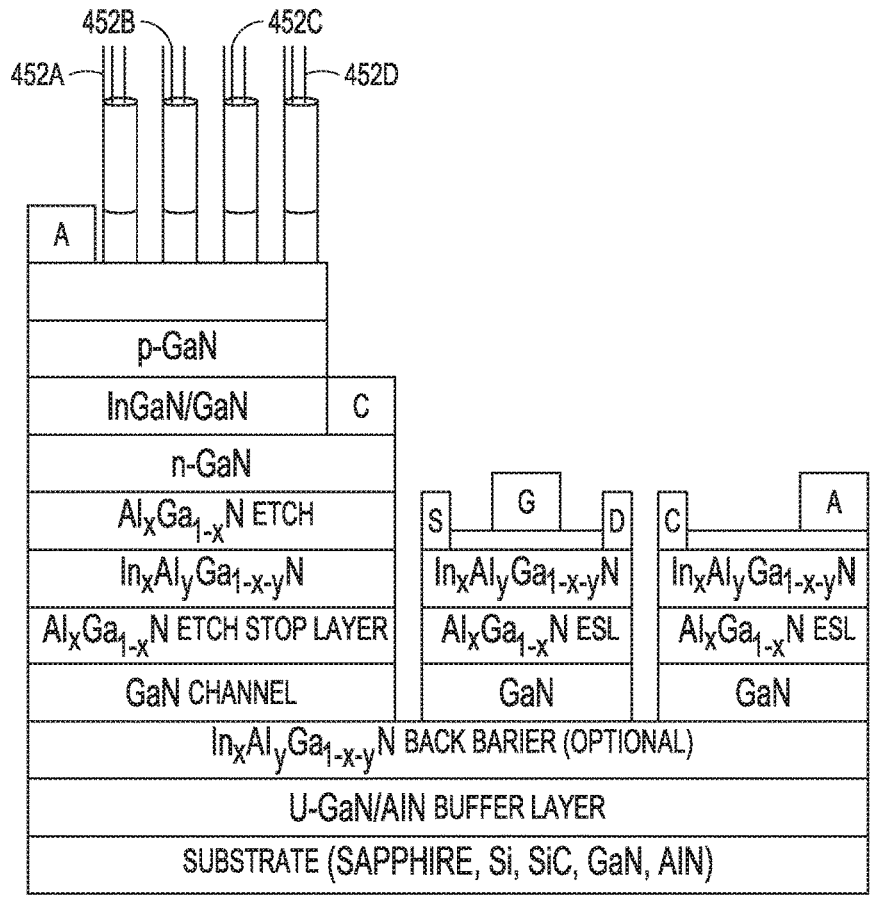

FIG. 7G depicts a formation of individual lenses of the process fabrication flow. The optional lenses 452A-452D, e.g., flat lenses, shown in FIG. 7G can be formed using the nanoscale printing system available from Nano OPS, Inc. The lenses 452A-452D, which can be positioned adjacent an end of a corresponding nanoemitter, can be configured to receive and focus the light emitted at the specified emission wavelength from the nanoemitter. The optional lenses can be made from titanium dioxide ($TiO_2$) or silicon dioxide ($SiO_2$), for example.

Figure 8:
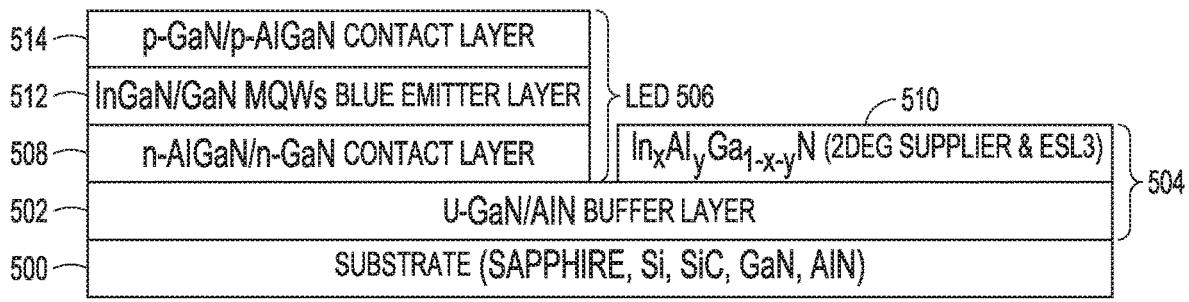
FIG. 8 depicts another example of starting materials that can be used in an example process fabrication flow.

FIG. 8 depicts another example of starting materials that can be used in an example process fabrication flow. Generally, the layers of materials in FIG. 8 can be used to produce substrate layer 500, buffer layer 502, an HEMT structure 504 not embedded into a light emitting structure (in contrast to FIGS. 6A-6K), and a light emitter 506, e.g., blue LED.

Starting at the bottom, a substrate layer 500 can be formed, e.g., sapphire, silicon (Si), silicon carbide (SiC), GaN, and aluminum nitride (AlN), for example. On top of the substrate layer 500, a buffer layer 502 can be formed, e.g., a u-GaN layer or AlN layer.

On top of the buffer layer 502, an n-AlGaN or n-GaN contact layer 508 can be formed as part of the light emitter, e.g., LED. In addition, adjacent the contact layer 508 and on the buffer layer 502, an InAlGaN layer 510 can be formed as a 2DEG supplier as part of the HEMT structure.

Next, an InGaN or GaN multiple quantum well (MQW) layer 512 can be formed on the contact layer 508. Then, a p-GaN or p-AlGaN contact layer 514 can be formed on the MQW layer 512.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A monolithically integrated assembly of nanoemitters of light having at least one specified emission wavelength in response to at least one input wavelength generated in the assembly, the assembly comprising:
   a plurality of transistors positioned on a substrate;
   a light emitter positioned on the substrate and configured to generate light in the assembly at the at least one input wavelength in response to an electrical input signal; and
   a plurality of nanoemitters, configured to receive light from the light emitter, an individual one of the nanoemitters coupled to a corresponding transistor of the plurality of transistors that selectively controls light emission from the nanoemitter in response to a control signal received by the corresponding transistor an individual one of the nanoemitters including:
      a waveguide positioned within the nanoemitter, the waveguide including a waveguiding dimension sized to be capable of receiving and guiding light at the at least one input wavelength;
      a quantum dot arrangement positioned within the nanoemitter, the quantum dot arrangement arranged to receive the at least one input wavelength of light and, in response, to generate responsive light; and
      a light filter positioned within the nanoemitter, the light filter arranged to receive the responsive light from the quantum dot arrangement and, in response, to emit light from the assembly at a specified emission wavelength and to block light at the at least one input wavelength.

2. The assembly of claim 1, wherein the at least one input wavelength is less than about 500 nanometers.

3. The assembly of claim 1, wherein the at least one input wavelength is between about 450 and about 500 nanometers to produce blue light.

4. The assembly of claim 1, wherein the quantum dot arrangement includes:
   a first group of one or more quantum dots arranged to receive the at least one input wavelength of light and, in response, to generate responsive light at a first wavelength; and
   a second group of one or more quantum dots arranged to receive the at least one input wavelength of light and, in response, to generate responsive light at a second wavelength.

5. The assembly of claim 4, wherein the quantum dot arrangement includes:
   a third group of one or more quantum dots arranged to receive the at least one input wavelength of light and, in response, to generate responsive light at a third wavelength.

6. The assembly of claim 5, wherein the light at the first wavelength is red light, wherein the light at the second wavelength is blue light, and wherein the light at the third wavelength is green light.

7. The assembly of claim 5, wherein the first, second, and third groups of quantum dots are vertically arrangement with respect to one another.

8. The assembly of claim 5, wherein each of the first, second, and third groups of quantum dots include at least 10 quantum dots.

9. The assembly of claim 1, wherein the quantum dot arrangement includes:
   a group of one or more quantum dots arranged to receive the at least one input wavelength of light and, in response, to generate responsive light at only a first wavelength.

10. The assembly of claim 1, wherein the light emitter is a light emitting; diode.

11. The assembly of claim 1, wherein the light emitter is a laser.

12. The assembly of claim 1, wherein the light filter includes a distributed Bragg reflector (DBR).

13. The assembly of claim 12, further comprising:
   a lens positioned adjacent an end of at least one of the nanoemitters, the lens configured to receive and focus the light emitted at the specified emission wavelength.

14. The assembly of claim 1, in combination with a display device.

15. The assembly of claim 1, in combination with a spectrometer.

16. A monolithically integrated assembly of nanoemitters of light having at least one specified emission wavelength in response to at least one input wavelength generated in the assembly, the assembly comprising:
   means for generating light in the assembly at the at least one input wavelength in response to an electrical input signal, the means for generating light positioned on a substrate;
   a plurality of nanoemitters, configured to receive light from the means for generating light;
   means for selectively controlling light emission from individual ones of the plurality of nanoemitters in response to a control signal received by the means for selectively controlling light emission, the means for selectively controlling light emission positioned on the substrate;
   an individual one of the nanoemitters including:
      means for receiving and guiding light at the at least one input wavelength, the means for receiving and guiding light positioned within the nanoemitter;
      a quantum dot arrangement positioned within the nanoemitter, the quantum dot arrangement arranged to receive the at least one input wavelength of light and, in response, to generate responsive light; and
      means for receiving light from the quantum dot arrangement and, in response, emitting light from the assembly at a specified emission wavelength and block light at the at least one input wavelength, the means for receiving light om the quantum dot arrangement positioned within the nanoemitter.

17. The assembly of claim 16, wherein the at least one input wavelength is between about 450 and about 500 nanometers to produce blue light.

18. The assembly of claim 16, wherein the means for receiving light from the quantum dot arrangement includes a distributed Bragg reflector (DBR).

19. The assembly of claim 16, wherein the quantum dot arrangement includes:
   a first group of one or more quantum dots arranged to receive the at least one input wavelength of light and, in response, to generate responsive light at a first wavelength; and
   a second group of one or more quantum dots arranged to receive the at least one input wavelength of light and, in response, to generate responsive light at a second wavelength.

20. The assembly of claim 19, wherein the quantum dot arrangement includes:

a third group of one or more quantum dots arranged to receive the at least one input wavelength of light and, in response, to generate responsive light at a third wavelength.

21. The assembly of claim 20, wherein the light at the first wavelength is red light, wherein the light at the second wavelength is blue light, and wherein the light at the third wavelength is green light.

22. A method of generating at least one specified emission wavelength in response to at least one input wavelength generated in a monolithically integrated assembly of nanoemitters, the method comprising:
generating light in the assembly, using a plurality of light emitters positioned on a substrate, at the at least one input wavelength in response to an electrical input signal; and
receiving, by the nanoemitters, light from the light emitter and selectively controlling light emission from an individual one of the nanoemitters in response to a control signal received by a corresponding transistor positioned on the substrate, the receiving including:
receiving and guiding light, using a waveguide, at the at least one input wavelength;
receiving, using a quantum dot arrangement positioned on the waveguide, the at least one input wavelength of light and, in response, generating responsive light; and
receiving the responsive light, using a light filter positioned on the waveguide, and, in response, emitting light from the assembly at a specified emission wavelength and blocking light at the at least one input wavelength.

23. The method of claim 22, further comprising:
receiving and focusing the light emitted at the specified emission wavelength.

* * * * *

UNITED STATES PATENT AND TRADEMARK OFFICE
CERTIFICATE OF CORRECTION

PATENT NO. : 11,049,900 B2  
APPLICATION NO. : 16/532189  
DATED : June 29, 2021  
INVENTOR(S) : Azize et al.

Page 1 of 1

It is certified that error appears in the above-identified patent and that said Letters Patent is hereby corrected as shown below:

In the Claims

In Column 13, Line 17, in Claim 1, after "transistor", insert --,--

In Column 14, Line 6, in Claim 10, delete "emitting;" and insert --emitting-- therefor In Column 14, Line 48, in Claim 16, delete "om" and insert --from-- therefor Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*